United States Patent
Xie

(10) Patent No.: US 8,299,813 B2
(45) Date of Patent: Oct. 30, 2012

(54) OVER CURRENT PROTECTION TEST SYSTEM

(75) Inventor: Ling-Yu Xie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 374 days.

(21) Appl. No.: 12/753,292

(22) Filed: Apr. 2, 2010

(65) Prior Publication Data

US 2011/0140725 A1   Jun. 16, 2011

(30) Foreign Application Priority Data

Dec. 16, 2009   (CN) .......................... 2009 1 0311614

(51) Int. Cl.
*G01R 31/28* (2006.01)

(52) U.S. Cl. ......... 324/763.01; 324/763.02; 324/765.01; 324/771; 324/764.01; 327/178; 327/179; 327/180

(58) Field of Classification Search ............. 324/763.01, 324/763.02, 765.01, 771, 764.01, 121; 327/178–180
See application file for complete search history.

(56) References Cited

U.S. PATENT DOCUMENTS

| | | | | |
|---|---|---|---|---|
| 5,841,641 | A * | 11/1998 | Faulk | 363/21.14 |
| 5,898,557 | A * | 4/1999 | Baba et al. | 361/103 |
| 7,145,108 | B2 * | 12/2006 | Kanel et al. | 219/492 |
| 7,190,291 | B2 * | 3/2007 | Markowski et al. | 341/122 |
| 7,595,615 | B2 * | 9/2009 | Li et al. | 323/277 |
| 7,714,528 | B2 * | 5/2010 | Chen et al. | 318/599 |
| 2006/0227480 | A1 * | 10/2006 | Zhou et al. | 361/103 |
| 2008/0265869 | A1 * | 10/2008 | Babb | 324/86 |
| 2008/0304297 | A1 * | 12/2008 | Hsieh | 363/50 |

* cited by examiner

*Primary Examiner* — Huy Q Phan
*Assistant Examiner* — Thang Le
(74) *Attorney, Agent, or Firm* — Altis Law Group, Inc.

(57) ABSTRACT

A system includes a switching power supply, an electric load connected to the switching power supply, a voltage regulation circuit, and a detect device. The voltage regulation circuit is connected to the electric load and configured to output a Pulse Width Modulation (PWM) signal to regulate a voltage supplied to the electric load. The detect device is connected to the switching power supply for detecting whether the switching power supply is powered off when a current flowing to the electric load exceeds a preset tolerance value.

16 Claims, 3 Drawing Sheets

OVER CURRENT PROTECTION TEST SYSTEM

BACKGROUND

1. Technical Field

The present disclosure relates to an over current protection (OCP) test system for a switching power supply.

2. Description of Related Art

Many personal computers utilize a switching power supply for providing direct current (DC) power sources (e.g., 3V, 5V, 12V, etc.) to components thereof. The switching power supply usually has an OCP function to detect whether an output current to each of the components exceeds a preset tolerance value. If the output current exceeds the preset tolerance value, the switching power supply is automatically powered off to protect the components.

In order to provide users with qualified switching power supplies, the switching power supplies should pass OCP test. In typical OCP test systems, each of the power supplies is connected to an electric load. The electric load has a knob to adjust a resistance value of the electric load. An operator should operate the knob to steadily decrease resistance of the load, thus increasing current flowing to the load. However, the resistance value of the electric load does not vary linearly, and the variation of the current flowing to the electric load is not linear, which makes it difficult to test the power supplies in a consistent manner.

What is needed, therefore, is an OCP test system capable of automatically controlling linearly varying current flowing to an electric load.

DETAILED DESCRIPTION

The disclosure is illustrated by way of example and not by way of limitation. In the figures of the accompanying drawings in which like references indicate similar elements. It should be noted that references to "an" or "one" embodiment in this disclosure are not necessarily to the same embodiment, and such references mean at least one.

Figure 1:
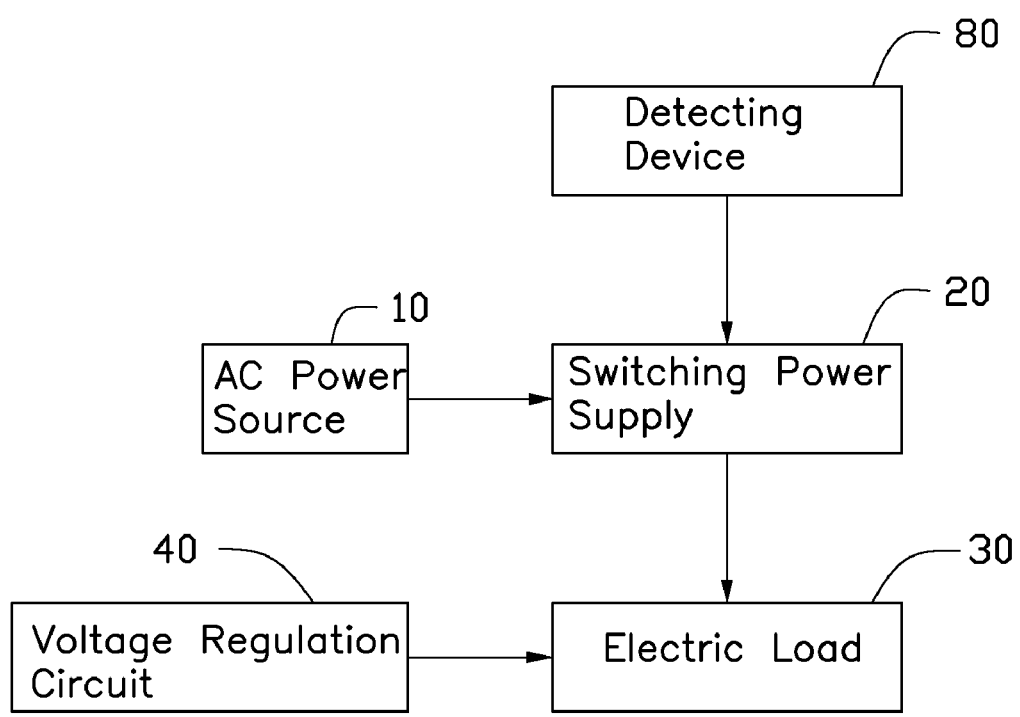
FIG. 1 is a block diagram of an OCP test system according to an embodiment.

Referring to FIG. 1, an embodiment of an OCP test system includes an AC power source 10, a switching power supply 20 connected to the AC power source 10, an electric load 30 connected to the switching power supply 20, a voltage regulation circuit 40 connected to the electric load 30, and a detecting device 80 connected to the switching power supply 20.

Figure 2:
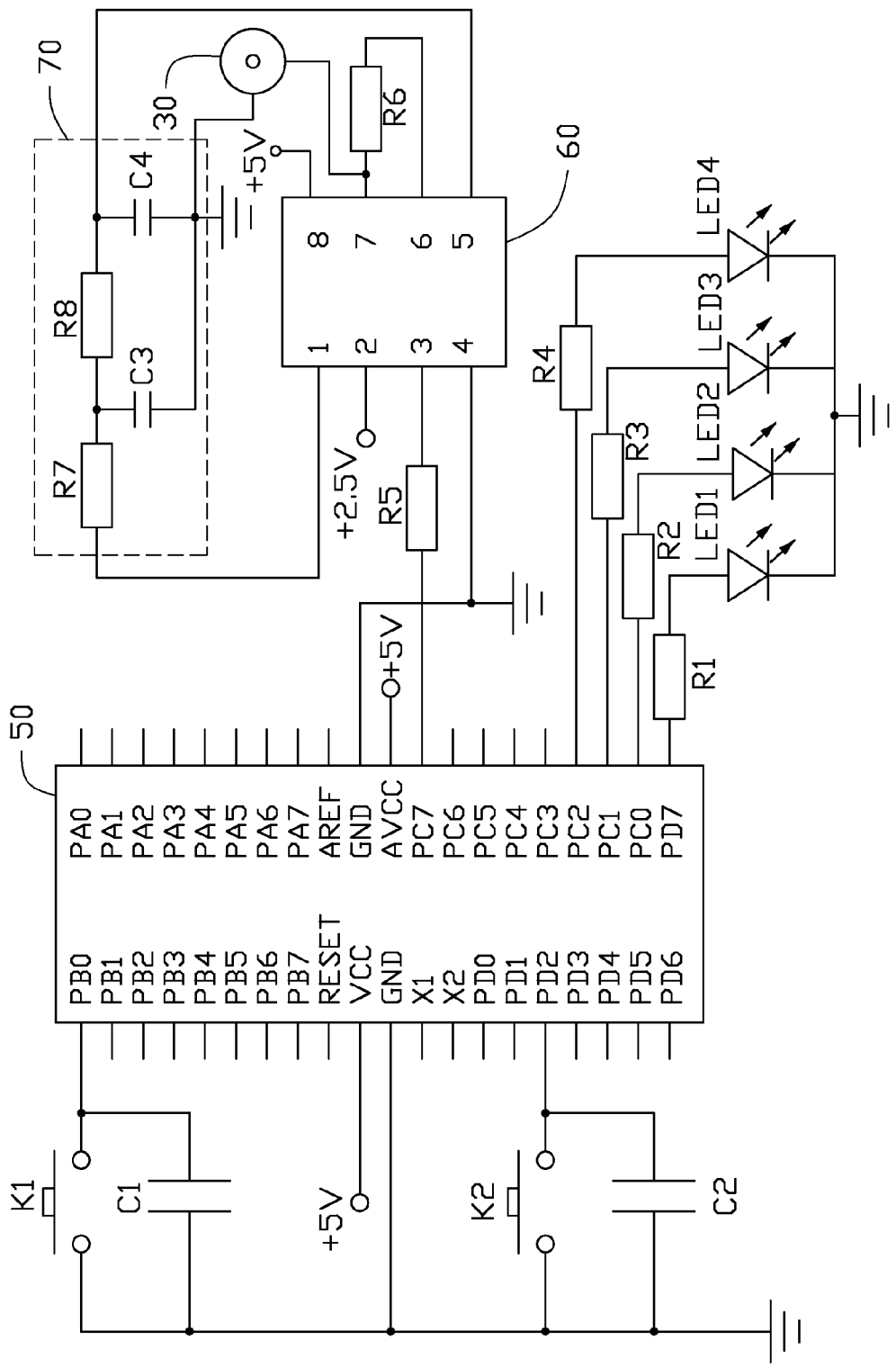
FIG. 2 illustrates a detailed circuit diagram of a voltage regulation circuit in FIG. 1.
Figure 3:
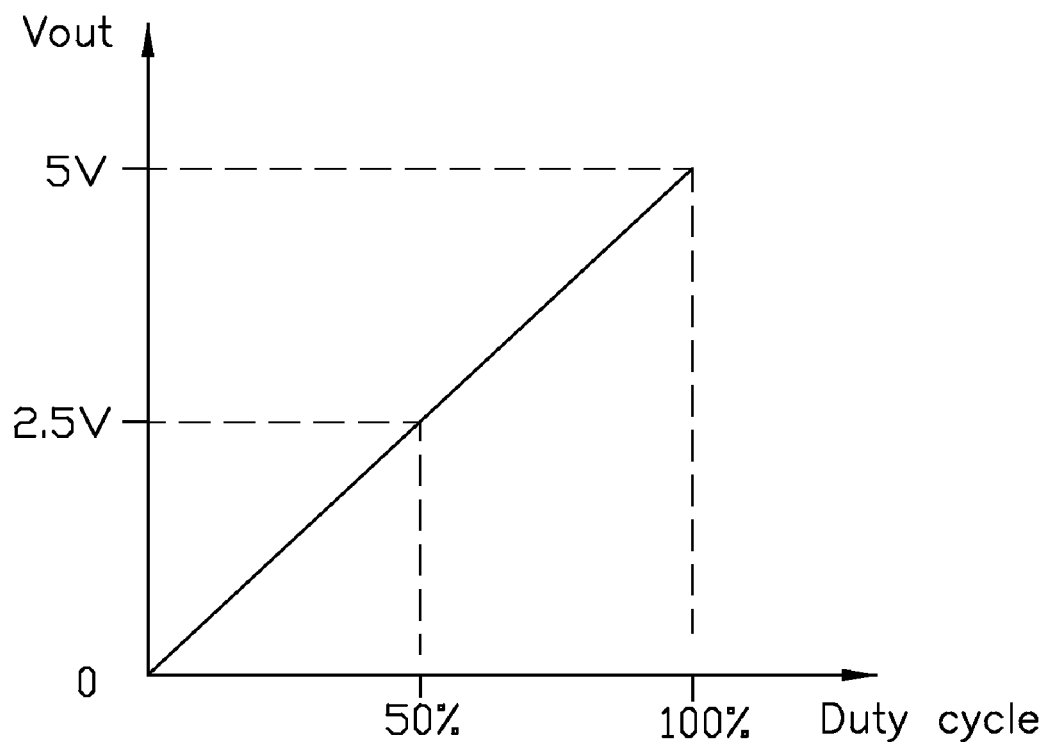
FIG. 3 illustrates a relationship between a voltage signal and a duty cycle of a PWM signal.

Referring to FIGS. 2 and 3, the voltage regulation circuit 40 includes a micro controller unit (MCU) 50, a chip 60 connected to the MCU 50, and a digital/analog converter (DAC) circuit 70 connected to the chip 60. In the embodiment, the MCU 50 is an ATmeg16L single chip microcontroller, and the chip 60 is a LM358 chip integrated with two individual amplifiers. The MCU 50 is capable of outputting a Pulse-Width Modulation (PWM) signal via its I/O pin PC7 to regulate the voltage supplied to the electric load 30. A duty cycle of the PWM signal is in direct proportion to the voltage fed to the electric load 30 (See FIG. 3). The PWM signal is a digital signal, and the DAC circuit 70 is capable of converting the digital signal to an analog signal. One of the amplifiers of the chip 60 is capable of amplifying the analog signal to supply a voltage at a required value to the electric load 30.

A first key K1 is connected to an I/O pin PB0 of the MCU 50. A first filter capacitor C1 is connected to the first key K1 in parallel. The first key K1 is configured to select one of a first test mode, a second test mode, and a third test mode. If the first test mode is selected, a maximum value of the duty cycle of the PWM signal is 25%. If the second test mode is selected, a maximum value of the duty cycle of the PWM signal is 50%. If the third test mode is selected, a maximum value of the duty cycle of the PWM signal is 75%. If the first test mode is currently enabled and the first key K1 is triggered once, the second test mode is selected and enabled instead of the first test mode, and if the first key K1 is triggered again, the third test mode will replace the second test mode.

A second key K2 is connected to an I/O pin PD2 of the MCU 50. A second filter capacitor C2 is connected to the second key K2 in parallel. The second key K2 is configured to start the MCU 50.

Indicating lamps LED1-LED4 are connected to the MCU 50 via resistors R1-R4 respectively. The indicating lamps LED1-LED3 are configured to indicate enabled states of the first test mode, the second test mode, and the third test mode. If the first test mode is enabled, the indicating lamp LED1 is powered on. If the second test mode is enabled, the indicating lamp LED2 is powered on. If the third test mode is enabled, the indicating lamp LED3 is powered on. The indicating lamp LED4 is configured to indicate a working state of the MCU 50. If the MCU 50 is working, the indicating lamp LED4 is powered on; and if the MCU 50 stops working, the indicating lamp LED4 is powered off.

The chip 60 includes pins 1-8. The pin 3 of the chip 60 is connected to the I/O pin PC7 of the MCU 50 via a resistor R5 for receiving the PWM signal from the MCU 50. The pins 2 and 8 of the chip 60 are respectively connected to +2.5V and +5V power sources. The pin 1 of the chip 60 is connected to the DAC circuit 70. The DAC circuit 70 includes resistors R7-R8 and capacitors C3-C4. The resistors R7 and R8 are connected in series between the pin 1 and the pin 5 of the chip 60. The capacitor C3 is connected to the resistor R7, and the capacitor C4 is connected to the resistor R8. A resistor R6 is connected between the pin 6 and pin 7 of the chip 60. One terminal of the electric load 30 is connected to ground, and another terminal of the electric load 30 is connected to the pin 7 of the chip 60. The PWM signal output from the MCU 50 is capable of being converted to an analog signal by the DAC circuit 70 and amplified by the chip 60 before supplying an output voltage to the electric load 30.

During performing the OCP test on the switching power supply, the second key K2 is actuated to start the MCU 50. The first key K1 is actuated to select one of the test modes. The MCU 50 outputs a PWM signal. A duty cycle of the PWM signal can vary linearly, and a maximum value of the duty cycle (25%, 50%, or 75%) is corresponding to the currently enabled test mode. The chip 60 receives the PWM signal from the MCU 50. The DAC circuit 70 converts the PWM signal to an analog signal. One of the amplifiers of the chip 60 amplifies the analog signal and supplies an analog power source to the electric load 30. The pin 7 of the chip 60 supplies an output voltage to the electric load 30, and the current flows to the electric load 30. The switching power supply 20 is capable of detecting whether the current flowing to the electric load 30 exceeds a preset tolerance value. The detecting device 80 detects whether the switching power supply 20 is automatically powered off when the current flowing to the electric load 30 exceeds the preset tolerance value. If the switching power supply 20 is automatically powered off when the current exceeds the preset tolerance value, the switching power supply 20 passes the OCP test; otherwise, the switching power supply 20 fails.

In one embodiment, the MCU 50 can control the duty cycle of the PWM signal to vary linearly. The voltage supplied to the electric load 30 is in direct proportion to the voltage supplied to the electric load 30 and can also vary linearly. Thus, a current flowing to the electric load 30 can vary linearly, which satisfies a current variation requirement during performing the OCP test.

While the present disclosure has been illustrated by the description of preferred embodiments thereof, and while the preferred embodiments have been described in considerable detail, it is not intended to restrict or in any way limit the scope of the appended claims to such details. Additional advantages and modifications within the spirit and scope of the present disclosure will readily appear to those skilled in the art.

Therefore, the present disclosure is not limited to the specific details and illustrative examples shown and described.

What is claimed is:

1. A system comprising:
a switching power supply capable of being supplied with an alternating current power source;
an electric load connected to the switching power supply; and
a voltage regulation circuit, connected to the electric load, configured to output a linear voltage to the electric load while the switching power supply is undergoing an Over Current Protection (OCP) test; wherein the voltage regulation circuit comprises a micro controller unit (MCU) which is configured to output a Pulse Width Modulation (PWM) signal to a chip, a Digital/Analog Converter (DAC) circuit is connected to the chip, the chip is configured to transmit the PWM signal to the DAC circuit, the DAC circuit is configured to convert the PWM signal to an analog signal, the DAC circuit is configured to transmit the analog signal to the chip, one amplifier of the chip is configured to amplify the analog signal, and the amplifier is configured to supply an output voltage to the electric load according to the amplified analog signal.

2. The system as described in claim 1, wherein a duty cycle of the PWM signal is in direct proportion to the output voltage fed to the electric load.

3. The system as described in claim 1, wherein a first key is connected to the MCU, the first key is configured to select one of predetermined test modes; and the duty cycle of the PWM signal is corresponding to the selected one of the predetermined test modes.

4. The system as described in claim 3, further comprising a plurality of light emitting diodes (LEDS), connected to the MCU, corresponding to the predetermined test modes, wherein one of the LEDS is powered on to indicate the selected one of the test modes is enabled.

5. The system as described in claim 3, wherein a first filter capacitor is connected to the first key in parallel.

6. The system as described in claim 1, wherein a second key is connected to the MCU, and the second key is configured to start the MCU.

7. The system as described in claim 6, wherein an LED is connected to the MCU, the LED is configured to indicate a working state of the MCU.

8. The system as described in claim 1, wherein the DAC circuit comprises a first resistor, a second resistor, a first capacitor, and a second resistor, the first resistor and the second resistor are connected in series between a first pin and a second pin of the chip, the first capacitor connects the first resistor to ground, and the second capacitor connects the second resistor to ground.

9. A system comprising:
a switching power supply;
an electric load connected to the switching power supply;
a voltage regulation circuit connected to the electric load, wherein the voltage regulation circuit comprises a micro controller unit (MCU) which is configured to output a Pulse Width Modulation (PWM) signal to a chip, a Digital/Analog Converter (DAC) circuit is connected to the chip, the chip is configured to transmit the PWM signal to the DAC circuit, the DAC circuit is configured to convert the PWM signal to an analog signal, the DAC circuit is configured to transmit the analog signal to the chip, one amplifier of the chip is configured to amplify the analog signal, and the amplifier is configured to supply an output voltage to the electric load according to the amplified analog signal; and
a detect device, connected to the switching power supply, capable of detecting whether the switching power supply is powered off when a current flowing to the electric load exceeds a preset tolerance value.

10. The system as described in claim 9, wherein a duty cycle of the PWM signal is in direct proportion to the output voltage fed to the electric load.

11. The system as described in claim 9, wherein a first key is connected to the MCU, the first key is configured to select one of predetermined test modes, and the duty cycle of the PWM signal is corresponding to the selected one of the predetermined test modes.

12. The system as described in claim 11, further comprising a plurality of light emitting diodes (LEDS), connected to the MCU, corresponding to the predetermined test modes, wherein one of the LEDS is powered on to indicate the selected one of the test modes is enabled.

13. The system as described in claim 9, wherein a second key is connected to the MCU, and the second key is configured to start the MCU.

14. The system as described in claim 13, wherein an LED is connected to the MCU, the LED is configured to indicate a working state of the MCU.

15. The system as described in claim 13, wherein a first filter capacitor is connected to the second key in parallel.

16. The system as described in claim 9, wherein the DAC circuit comprises a first resistor, a second resistor, a first capacitor, and a second resistor, the first resistor and the second resistor are connected in series between a first pin and a second pin of the chip, the first capacitor connects the first resistor to ground, and the second capacitor connects the second resistor to ground.

* * * * *